United States Patent
McComb et al.

(10) Patent No.: US 9,853,411 B2
(45) Date of Patent: Dec. 26, 2017

(54) PULSED BIAS CURRENT FOR GAIN SWITCHED SEMICONDUCTOR LASERS FOR AMPLIFIED SPONTANEOUS EMISSION REDUCTION

(71) Applicant: nLight Photonics Corporation, Vancouver, WA (US)

(72) Inventors: Timothy S. McComb, Portland, OR (US); Dennis McCal, Lake Oswego, OR (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

(21) Appl. No.: 14/144,344

(22) Filed: Dec. 30, 2013

(65) Prior Publication Data

US 2014/0185643 A1   Jul. 3, 2014

Related U.S. Application Data

(60) Provisional application No. 61/747,838, filed on Dec. 31, 2012.

(51) Int. Cl.
| | |
|---|---|
| *H01S 3/091* | (2006.01) |
| *H01S 3/067* | (2006.01) |
| *H01S 3/23* | (2006.01) |
| *H01S 5/042* | (2006.01) |
| *H01S 5/062* | (2006.01) |
| *H01S 3/094* | (2006.01) |

(52) U.S. Cl.
CPC ........ *H01S 3/06754* (2013.01); *H01S 3/2375* (2013.01); *H01S 5/0428* (2013.01); *H01S 5/06216* (2013.01); H01S 3/094003 (2013.01); H01S 2301/02 (2013.01)

(58) Field of Classification Search
CPC ............. H01S 3/06754; H01S 3/094; H01S 3/094076; H01S 5/0428; H01S 5/06216; H01S 3/2375; H01S 3/094003; H01S 2301/02
USPC .................................. 372/38.1, 38.02, 38.07
See application file for complete search history.

(56) References Cited

U.S. PATENT DOCUMENTS

| | | | |
|---|---|---|---|
| 8,787,415 B1 * | 7/2014 | Budai ................ | H01S 5/0261 372/29.01 |
| 2002/0075919 A1 * | 6/2002 | Tochio .................... | H01S 5/042 372/38.02 |
| 2005/0117616 A1 | 6/2005 | Yamasaki et al. | |

(Continued)

FOREIGN PATENT DOCUMENTS

WO    WO 2011000411 A1 *  1/2011  ............. H01S 5/062

OTHER PUBLICATIONS

Preliminary data sheet, iC-HG 3A Laser Switch, iC Haus, 21 pages (2011).

(Continued)

*Primary Examiner* — Yuanda Zhang
(74) *Attorney, Agent, or Firm* — Klarquist Sparkman, LLP

(57) ABSTRACT

Gain switched laser diode pulses are used as seed pulses for optical pulse generation. ASE is reduced by applying a prebias to the laser diodes at an amplitude less than that associated with a laser diode threshold. An electrical seed pulse having an amplitude larger than that associated with laser threshold is applied within about 10-100 ns of the prebias pulse. The resulting laser diode pulse can be amplified in a pumped, rare earth doped optical fiber, with reduced ASE.

19 Claims, 8 Drawing Sheets

(56) References Cited

U.S. PATENT DOCUMENTS

| | | | |
|---|---|---|---|
| 2006/0159143 A1* | 7/2006 | Schleipen | G11B 7/126 |
| | | | 372/38.02 |
| 2011/0032605 A1 | 2/2011 | Kliner et al. | |
| 2012/0069860 A1 | 3/2012 | Inbar et al. | |
| 2012/0162749 A1* | 6/2012 | Gusev et al. | 359/341.3 |
| 2012/0250707 A1* | 10/2012 | Lu | B23K 26/0084 |
| | | | 372/25 |
| 2012/0263198 A1 | 10/2012 | Oba et al. | |

OTHER PUBLICATIONS

International Search Report and Written Opinion from International Application No. PCT/US2013/076702, dated Oct. 16, 2014, 6 pages.

\* cited by examiner

PULSED BIAS CURRENT FOR GAIN SWITCHED SEMICONDUCTOR LASERS FOR AMPLIFIED SPONTANEOUS EMISSION REDUCTION

CROSS REFERENCE TO RELATED APPLICATION

This application claims the benefit of U.S. Provisional Application No. 61/747,838, filed Dec. 31, 2012, which is incorporated herein by reference.

FIELD

The disclosure pertains to seed lasers for doped fiber laser systems.

BACKGROUND

Producing short optical pulses from semiconductor lasers with the intention of further amplifying the pulses in fiber amplifiers and using the pulses in applications such as materials processing puts a strong requirement on a seed source with low levels of CW amplified spontaneous emission (ASE), which if present would be amplified in the amplifier chain and produce amplifier emission between optical pulses. This emission can cause deleterious effects to sensitive materials in some applications and generally causes confusion about the true peak power of a laser. Measurements of pulse power in the presence of CW ASE may be mischaracterized as being associated with pulse power. Undesirable ASE also steals power from the pulses and thus causes a need for higher pump power for achievement of similar pulse energies in a given amplifier.

The cause of this ASE in conventional gain switched diodes (DFB, DBR, VBG or FBG externally stabilized and others) used to produce short optical pulses lies in the drive electronics mechanism. Conventionally such diodes are driven with a short electrical pulse and application of a DC bias current of a few to a few tens of mA. Under many driving conditions, this bias current results in ASE from the semiconductor material in a CW fashion, as the bias excites the semiconductor material such that it emits light continuously, but does not drive the device over laser threshold. This light is broadband, and much of it can be filtered by conventional spectral filters in an amplifier chain. However ASE in the passband of such filters (which for practical reasons are ~1-2 nm wide) cannot be removed, and results in a CW component in the laser output. This problem becomes increasingly worse as laser repetition rate is lowered, as the DC bias produces a constant amount of ASE regardless of pulse repetition rate. As pulse repetition rate is decreased, fewer optical pulses are emitted in a given time period and the ASE becomes an increasingly greater percentage of the output power. In extreme cases, ASE can be >90% of the output power (before spectral filtration) and >10% of the output power (after spectral filtration) when laser repetition rates are less than a few hundred kHz. These rates are desirable for materials processing and LIDAR transmitter applications, among others, so systems having reduced ASE are needed.

SUMMARY

Seed laser sources configured to reduce background emission in fiber laser systems include a laser diode and a laser diode driver configured to apply a pulsed laser drive signal to the laser diode. The laser drive signal is coupled to provide a seed signal portion to the laser diode having an amplitude greater than a laser diode threshold amplitude and a prebias portion having an amplitude less than the laser diode threshold and that is applied within about 100 ns of the seed signal portion. In some examples, the amplitude of the seed signal portion is at least 10 times the laser diode threshold amplitude and the prebias portion is applied within about 50 ns of the seed signal portion. In other examples, a product of an effective amplitude of the seed signal portion and a duration of the seed signal portion is at least 2 times greater than a product of an effective amplitude and a duration of the prebias signal portion. In still further examples, a product of an effective amplitude of the seed signal portion and a duration of the seed signal portion is at least 20 times greater than a product of an effective amplitude and a duration of the prebias signal portion. In some embodiments, the prebias signal portion has an amplitude less than about 0.5 times the laser diode threshold and is applied within about 25 ns of the seed signal portion. In further embodiments, the prebias signal portion has an amplitude less than about 0.2 times the laser diode threshold and is applied within about 25 ns of the seed signal portion. In other typical examples, the laser diode driver includes a seed signal generator and a prebias signal generator, and a signal combiner is configured to combine the seed signal and the prebias signal and couple the combined signal to the laser diode. The laser diode driver is configured to apply the pulsed laser drive signal to the laser diode at a repetition rate between 1 kHz and 50 MHz, or 1 kHz and 100 MHz. In some embodiments, the laser diode driver is configured so that the prebias signal portion terminates prior to the seed signal portion.

Methods comprise establishing optical gain in a laser gain medium and producing an optical seed pulse by applying a prebias signal to a laser diode, and a seed pulse signal to the prebiased laser diode. At least one optical pulse is produced from the laser gain medium in response to the optical seed pulse. In some examples, the laser gain medium is a doped optical fiber, and the optical gain medium is situated in a laser cavity defined by one or more fiber Bragg gratings or fiber couplers or combinations thereof. In typical examples, the seed pulse signal has an amplitude that is at least 5 times a laser diode threshold and the prebias signal has an amplitude that is less than about 0.5 times a laser diode threshold. In further embodiments, the prebias signal has a duration less than about 100 times a laser diode gain lifetime and the seed signal is applied during the prebias signal or within 10 times the laser diode gain lifetime after the prebias signal.

Systems for producing optical pulses comprise a laser diode and a laser diode drive source configured to repetitively apply a prebias signal and a seed signal to the laser diode to produce a seed laser pulse. A doped optical fiber is situated to receive the seed laser pulse, and at least one pump laser is configured to couple a pump laser beam to the doped optical fiber so as to produce optical gain in the doped optical fiber. In some examples, the prebias signal and the seed signal have amplitudes associated with about 0.5 times or less of a laser threshold and at least about 4 times the laser threshold, respectively, wherein the prebias signal is applied within about 25 ns of the seed signal. In other examples, a product of an effective amplitude of the seed signal and a duration of the seed signal is at least 2 times greater than a product of an effective amplitude and a duration of the prebias signal.

The foregoing and other objects, features, and advantages of the invention will become more apparent from the following detailed description, which proceeds with reference to the accompanying figures.

DETAILED DESCRIPTION

Figure 1:
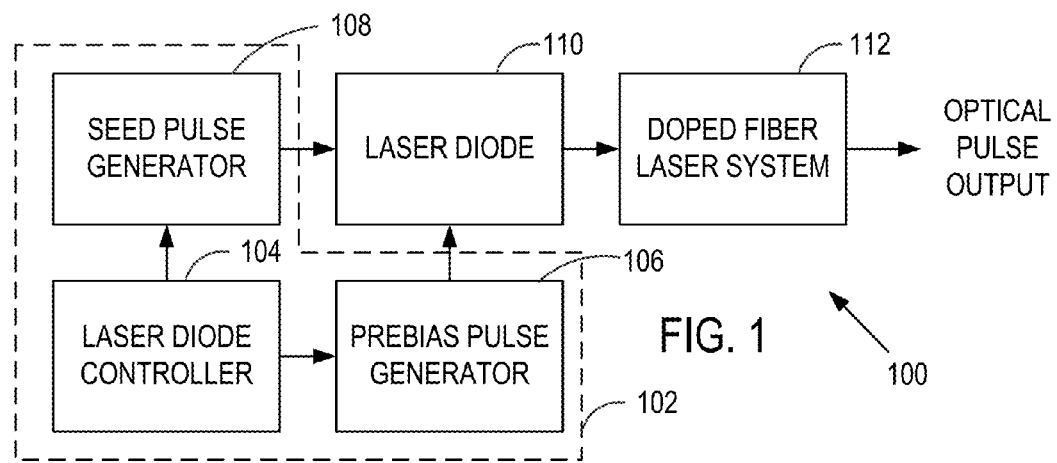
FIG. 1 is a block diagram of a representative seed laser system.

The following disclosure is presented in the context of representative embodiments that are not to be construed as being limiting in any way. This disclosure is directed toward all novel and non-obvious features and aspects of the various disclosed embodiments, alone and in various combinations and sub-combinations with one another. The disclosed methods, apparatus, and systems are not limited to any specific aspect or feature or combination thereof, nor do the disclosed embodiments require that any one or more specific advantages be present or problems be solved.

Although the operations of the disclosed methods are described in a particular, sequential order for convenient presentation, it should be understood that this manner of description encompasses rearrangement of the operations, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other things and methods.

This disclosure sometimes uses terms like "produce," "generate," "select," "receive," "exhibit," and "provide" to describe the disclosed methods. These terms are high-level abstractions of the actual operations that are performed. The actual operations that correspond to these terms may vary depending on the particular implementation and are readily discernible by one of ordinary skill in the art.

The singular forms "a," "an," and "the" include the plural forms unless the context clearly dictates otherwise. The term "includes" means "comprises." Unless the context dictates otherwise, the term "coupled" means mechanically, electrically, or electromagnetically connected or linked and includes both direct connections or direct links and indirect connections or indirect links through one or more intermediate elements not affecting the intended operation of the described system.

Certain terms may be used such as "up," "down," "upper," "lower," and the like. These terms are used, where applicable, to provide some clarity of description when dealing with relative relationships. But, these terms are not intended to imply absolute relationships, positions, and/or orientations.

The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting. Other features of the disclosure are apparent from the following detailed description and the claims.

Unless otherwise indicated, all numbers expressing quantities of components, percentages, temperatures, times, and so forth, as used in the specification or claims are to be understood as being modified by the term "about" or "approximately." Accordingly, unless otherwise indicated, implicitly or explicitly, the numerical parameters set forth are approximations that may depend on the desired properties sought and/or limits of detection under standard test conditions/methods. When directly and explicitly distinguishing embodiments from discussed prior art, the embodiment numbers are not approximates unless the word "about" is recited.

In the following description, various electrical signals are applied to laser diodes to control optical emissions. Such electrical signals are generally pulsed electrical signals. For convenient description, pulse durations can be based on time periods during which signal pulses are greater than about 0.5, 0.6, 0.7, 0.8, 0.9, or 0.95 of a peak amplitude. Pulse durations can also be based on time periods between a pulse start and a pulse end which can be defined as times at which a pulse increases or decreases, respectively, to about 0.1, 0.2, or 0.3 times an average peak value. Pulse rise and fall times can be associated with durations in which pulse amplitudes increase from about 10% of an average peak amplitude to about 90% of the average peak amplitude. In other examples, rise and fall times can be based on other fractions of pulse amplitudes such as 5%/95% or 20%/80%. Average pulse peak values can be used to avoid consideration of artifacts associated with high frequency, short duration spikes in a pulse. Pulse widths can be based on full widths at one-half pulse amplitude.

In typical examples, amplitudes of pulses applied to laser diodes are conveniently described based on signal amplitudes relative to a laser diode threshold value. Laser diodes threshold values are generally provided as threshold electrical currents, but as used herein, electrical currents, voltages, or combinations thereof can be used to define pulses applied to laser diodes. In addition, in some examples, two or more electrical signals are applied to a laser diode in a common time period. Such description is for convenience only, and electrical signals can be applied as a single signal corresponding to a combination of multiple signals.

In the following disclosure, decay of seed laser gain as a function of time is modeled as exponential, with a decay time constant $T_1$. In general, bias or prebias electrical pulses are applied followed by electrical seed pulses within a time in which a laser gain established by the bias or prebias electrical pulses is still appreciable. Typically, the electrical seed pulse is applied at a time at which the effects of the prebias pulse contribute to seed optical pulses, generally at times at which a seed laser gain is greater than about 0.1, 0.2, 0.5, 0.8, or 0.9 of a peak gain produced in response to a bias or prebias electrical pulse. Electrical seed pulse durations are generally between about 10 ps and 10 ns.

As disclosed herein, ASE can be reduced with a pulsed bias current. Rather than providing a constant DC bias having an amplitude less than a seed laser threshold value, a time dependent bias or "prebias" pulse is applied having an amplitude less than a laser threshold value and a duration on the order of 10-100 ns, 1-1000 ns, 2-500 ns, or 5-250 ns. The prebias pulse is applied so that a seed pulse or gain switched pulse that is greater that the seed laser threshold value is applied a time during which the seed laser is or remains biased by the prebias pulse. For a seed laser having a gain that decays with a time constant $T_1$, the seed pulse is generally applied during the prebias pulse or within about $nT_1$ after end of the prebias pulse, wherein n is a positive number less than about 4, 3, or 2. Typically, the seed pulse is applied at a time at which the effects of the prebias pulse contribute to seed pulse output, generally at times at which a seed laser gain is greater than about 0.1, 0.2, 0.5, 0.8, or 0.9 of a peak gain produced in response to the prebias pulse.

Prebias pulses can be characterized based on a product of prebias electrical signal amplitude and prebias pulse duration. For example, an integral of signal amplitude over a total prebias pulse duration can be used. Such an integral is referred to herein as an effective prebias. A prebias electrical pulse can be considered as establishing a laser gain (or population inversion). Variations in prebias electrical pulse amplitude prior to application of an electrical seed pulse generally effect optical seed pulses primarily due to the extent that seed laser gain is altered.

Seed pulses and prebias pulses can be applied at various repetition rates to produce optical pulses. At very high repetition rates ($F_{REP}$>1 MHz), a duty cycle ($F_{REP}T_{BIAS}$) associated with prebias pulses would approach one. For example, at 10 MHz and a prebias pulse duration of 100 ns, $F_{REP}T_{BIAS}$=1. At lower repetition rates, bias duty cycle can be <1%, leading to significantly reduced ASE. If ASE is linear with bias, reduction in ASE is directly proportional to duty cycle. A pulsed bias effectively fixes the percentage ASE content for all repetition rates. Duty cycle decreases as prebias repetition rate decreases, but so does the average power associated with the seed pulses so the ratio can be fixed. Thus, a ratio of ASE power to amplified output pulse power in a pulsed laser can be low (<99.5%) and this percentage can be the same at all repetition rates, assuming an optical amplifier that amplifies only the seed pulse and provides no additional ASE. Prebias and seed electrical signals can be selected to produce a single seed optical pulse, and avoid ringing. In addition, prebias pulses can also be used to obtain a selected optical seed pulse duration.

Referring to FIG. 1, a pulsed fiber laser system 100 includes a pulse generator 102 that includes a laser diode controller 104 coupled to a seed pulse generator 108 and a prebias pulse generator 1006 that provide an electrical seed pulse and a prebias pulse, respectively, to a laser diode 110. Typically, electrical seed pulses and prebias pulses are applied periodically to the laser diode 110 to produce periodic optical seed pulses. The optical seed pulses are coupled to a doped fiber laser system 112 to produce pulsed optical output. The prebias pulses are selected to reduce ASE, and are generally initiated about 2-50 ns prior to application of the electrical seed pulses.

Figure 2:
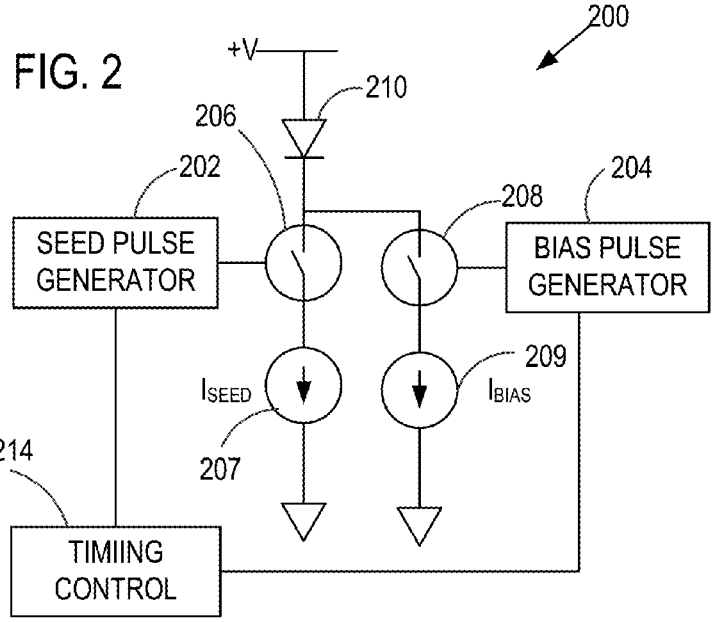
FIG. 2 is a block diagram of a representative seed laser system that includes switches configured to couple bias and seed currents to a laser diode.

FIG. 2 illustrates an optical seed pulse generator 200 that includes an electrical seed pulse generator 202 and a bias pulse generator 204. Seed pulses and bias pulses are selectively coupled to a laser diode 210 with switches 206, 208 that couple respective current sources 207, 209 to provide selected seed and bias currents. A timing controller 214 is coupled to the pulse generators 202, 204 so as to provide suitable pulse timing, and to select pulse durations and amplitudes.

Figure 3A:
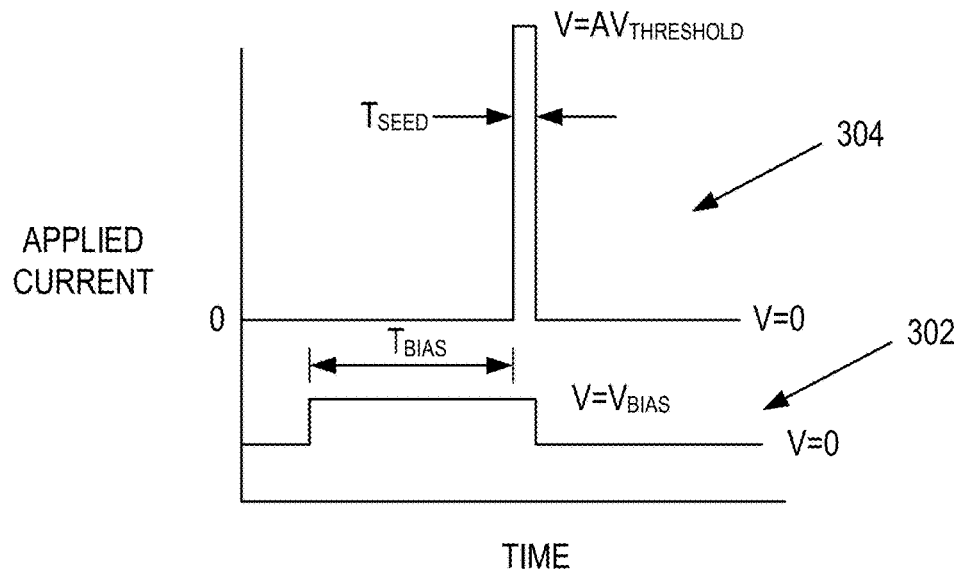
FIGS. 3A-3B illustrate representative electrical prebias and seed electrical pulses.
Figure 3B:
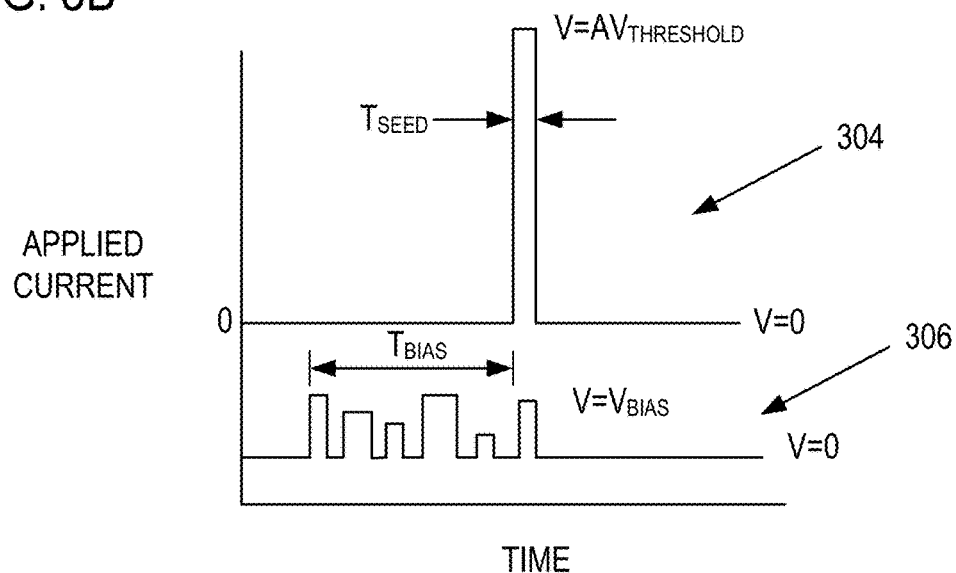

FIG. 3A illustrates representative electrical prebias and seed pulse currents as a function of time. As shown in FIG. 3, these pulses are represented as time varying currents, but time varying voltages can also be used. A prebias pulse 302 is illustrated as having a pulse duration $T_{BIAS}+T_{SEED}$, and is initiated at a bias time $T_{BIAS}$ prior to application of an electrical seed pulse 304. The electrical seed pulse 304 can have a duration much shorter than the electrical prebias pulse 302, and to effectively establish laser diode bias. $T_{BIAS}$ is preferably less than about 10-20 ns so that laser diode gain produced by the prebias pulse is available to the electrical seed pulse. The electrical seed pulse 304 generally has a duration of 1-2 ns or less, and an amplitude A that is at least 2, 5, 10, or 20 times a laser diode threshold value. The pulses 302, 304 are shown as square pulses, but pulse shapes generally vary. As noted above, such pulses can be characterized by total pulse area so long as inversion or other decays associated with a seed laser diode are not substantial. A more complex electrical prebias pulse is illustrated in FIG. 3B. If desired, prebias pulse amplitude can be weighted as a function of time so that earlier prebias pulse portions are accorded less weight due to decay of the associated gain. The prebias signal can be zero when the seed signal is applied.

Figure 4:
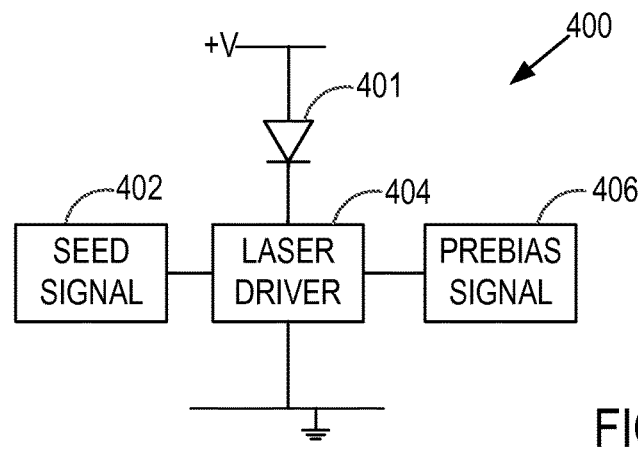
FIG. 4 is a block diagram of a representative seed laser system that includes a series coupled laser driver.

FIG. 4 illustrates a seed laser source 400 that includes a laser diode 401 that is series coupled to a laser driver 404. A seed pulse is supplied the laser driver 404 by a seed signal source 402, and a prebias pulse is supplied to the laser driver 404 by a prebias signal source 406.

Figure 5:
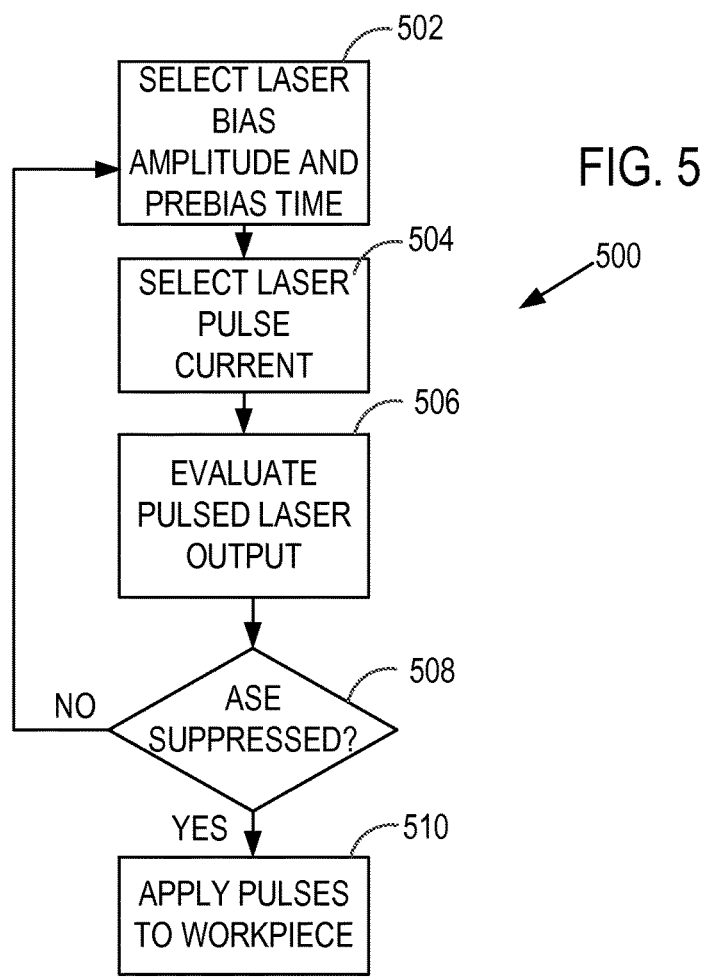
FIG. 5 is a representative method of producing laser pulses with reduced power output due to amplified spontaneous emission.

FIG. 5 illustrates a representative method 500 of producing laser pulses. At 502, an amplitude, duration, and initiation time of a prebias pulse is selected. Alternatively, an effective prebias can be selected and suitable amplitudes and durations can be chosen, with or without prebias pulse weighting. At 504, a laser pulse current (or electrical seed pulse) is selected, and at 506, optical pulses produced with the selected prebias and laser pulse current are evaluated. At 508, if ASE is sufficiently suppressed, the generated optical pulses are delivered to a workpiece at 510. If additional or improved ASE is desired, prebias parameters are reselected at 502, and other parameters reselected as well.

Figure 6:
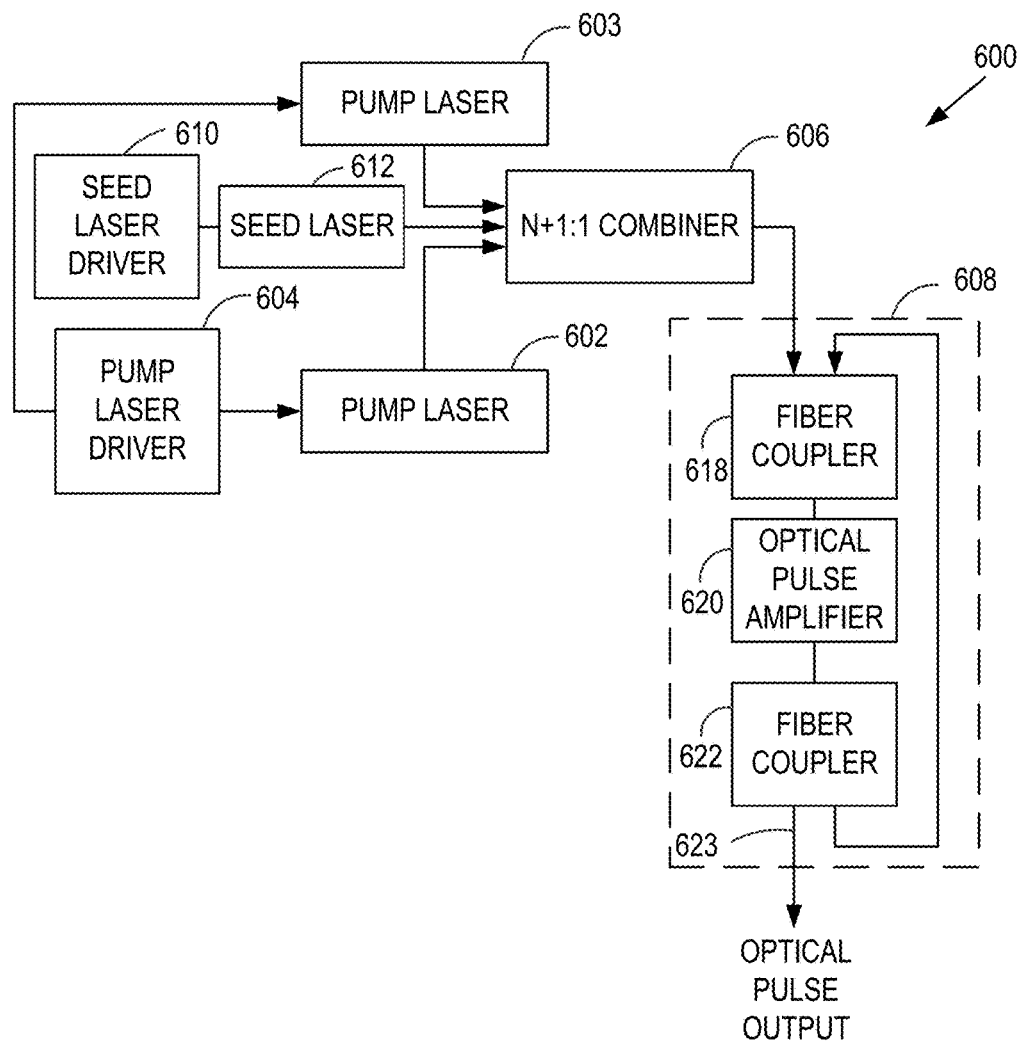
FIG. 6 is an example seed laser system that includes a radiofrequency power splitter configured to apply separate prebias and seed pulses to a laser diode.

FIG. 6 illustrates a representative pulsed laser system 600 that includes an ASE reducing seed laser driver 610 and seed laser 612. A pump laser driver 604 is coupled to pump lasers 602, 603 that are situated to provide pump optical beams to pump fibers of an N+1:1 combiner 606. The seed laser 612 is coupled to a signal fiber of the combiner 606, and an output of the signal fiber is coupled to a fiber laser system 608. A 2 by 2 fiber coupler 618 receives the combined pump laser and seed laser optical radiation, and delivers the combined radiation to an optical pulse amplifier 620. The optical pulse amplifier 620 includes a doped fiber such as a rare earth doped fiber which provides optical gain in response to the pump laser radiation so as to amplify the seed optical pulse. A fiber coupler 622 is connected to the optical pulse amplifier, and provides optical feedback (if desired) by coupling a portion of the optical power from the optical pulse amplifier back to the combiner 618 so as to establish a laser cavity. The fiber coupler 622 also provides optical pulse output at an output fiber.

In other examples, more or fewer pump lasers can be used, Bragg gratings or bulk reflectors can be used to define laser cavities, or optical amplification provided without a laser cavity. Single mode fibers are preferred, but various fiber types such as double clad fibers and polarization retaining fibers can be used.

Figure 7:
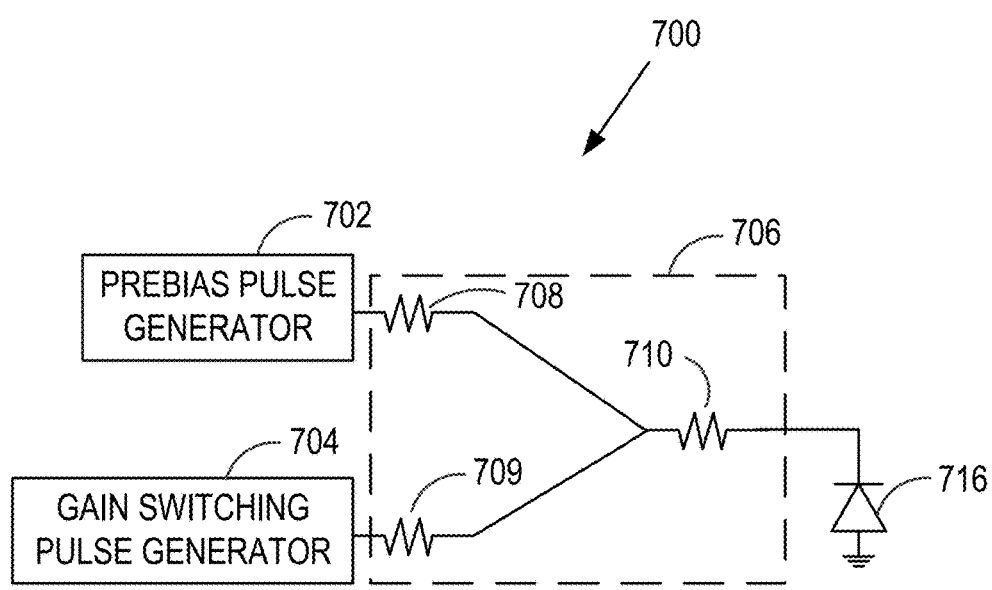
FIG. 7 illustrates application of prebias and seed pulses using a microwave power splitter.

FIG. 7 illustrates a seed pulse generator 700 that includes prebias pulse generator 702 and a gain switching pulse generator 704 coupled to a microwave power splitter 706. The power splitter 706 includes resistors 708, 709, 710 that can be selected to provide suitable split ratios or impedance matching. A laser diode 716 is configured to receive the combined pulses. Typical prebias pulses have durations of ~10-100 ns and seed pulses have durations of less than about 1-2 ns to achieve the actual gain switching. The power splitter 706 introduces signal loss that is compensated by increasing the signal amplitudes provided by the pulse generators 702, 704. In other examples, an arbitrary waveform generator (AWG) can be used to synthesize a single pulse of the desired shape, rather than adding two pulses (seed and prebias pulse). The AWG can be computer controlled so that pulse amplitudes, phases, and durations can be selected. An FPGA or microcontroller can be used. While in the examples above, no constant DC bias is shown, in some applications, a DC bias is applied.

Figure 8:
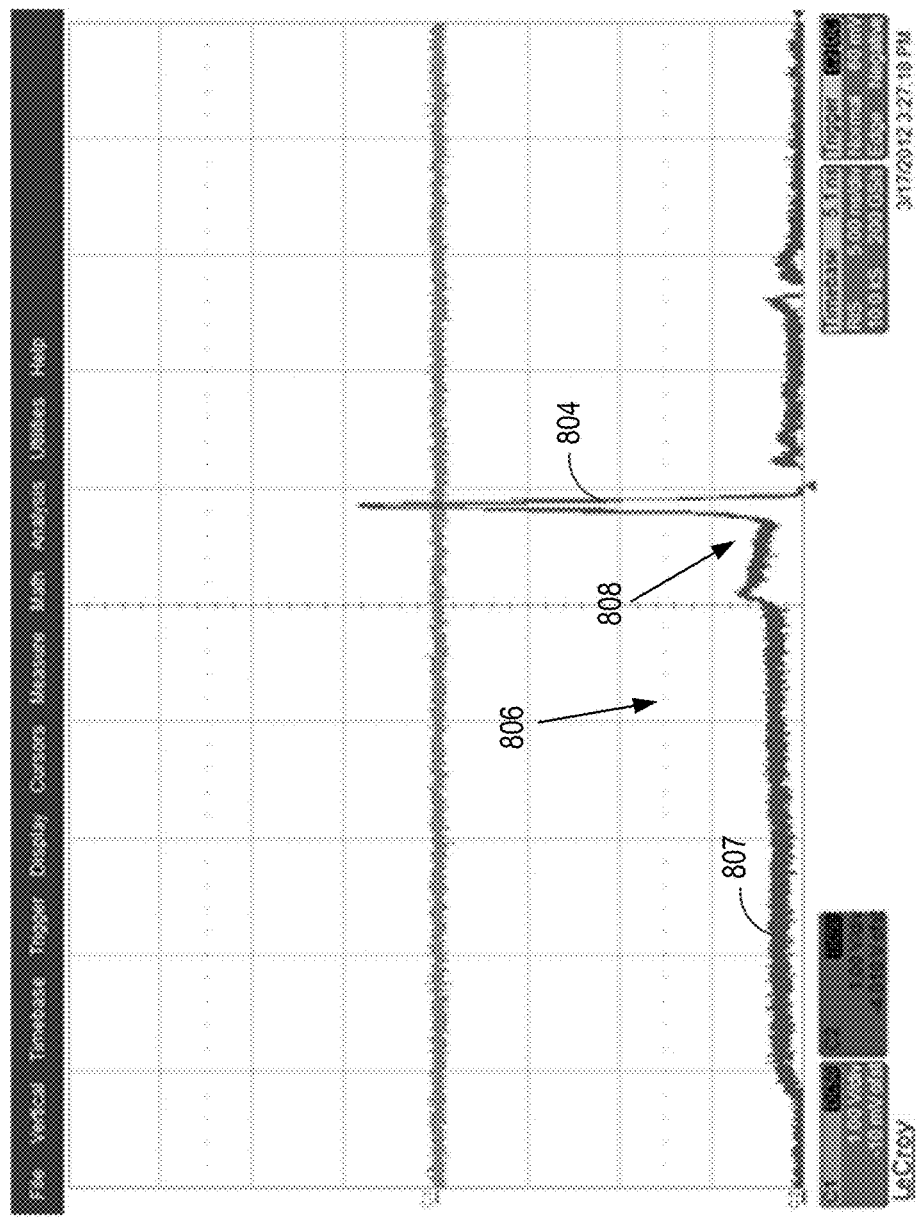
FIG. 8 illustrates a representative electrical pulse used to drive a seed laser.

FIG. 8 illustrates a representative laser diode drive pulse that includes a seed pulse portion 804 and a prebias pulse 806 having prebias portions 807, 808. The seed pulse portion 804 corresponds to about a 400 mA laser drive current and the prebias pulse duration is about 25 ns.

Figure 9:
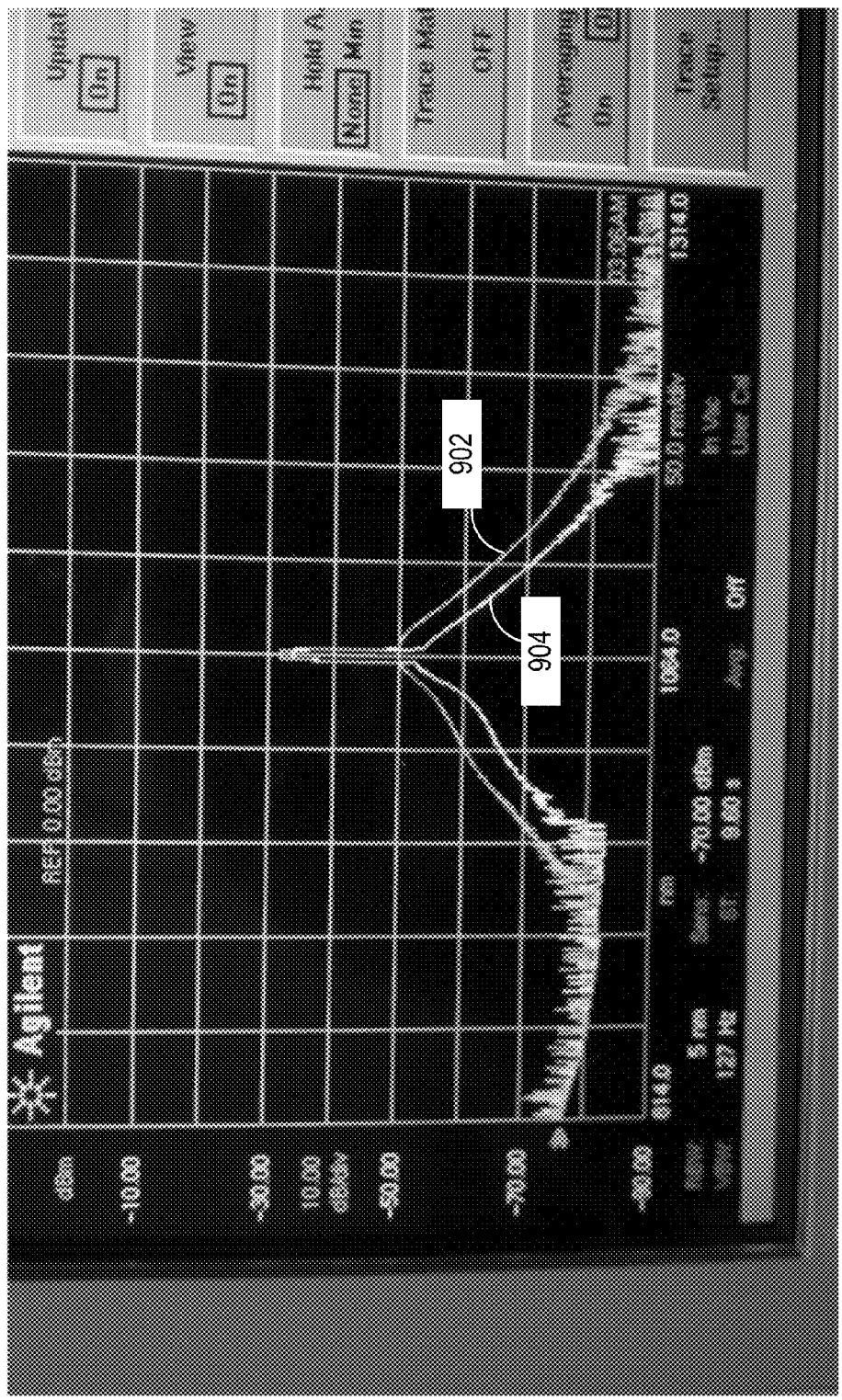
FIGS. 9-10 illustrate optical spectra of laser output with various prebias signal durations.
Figure 10:
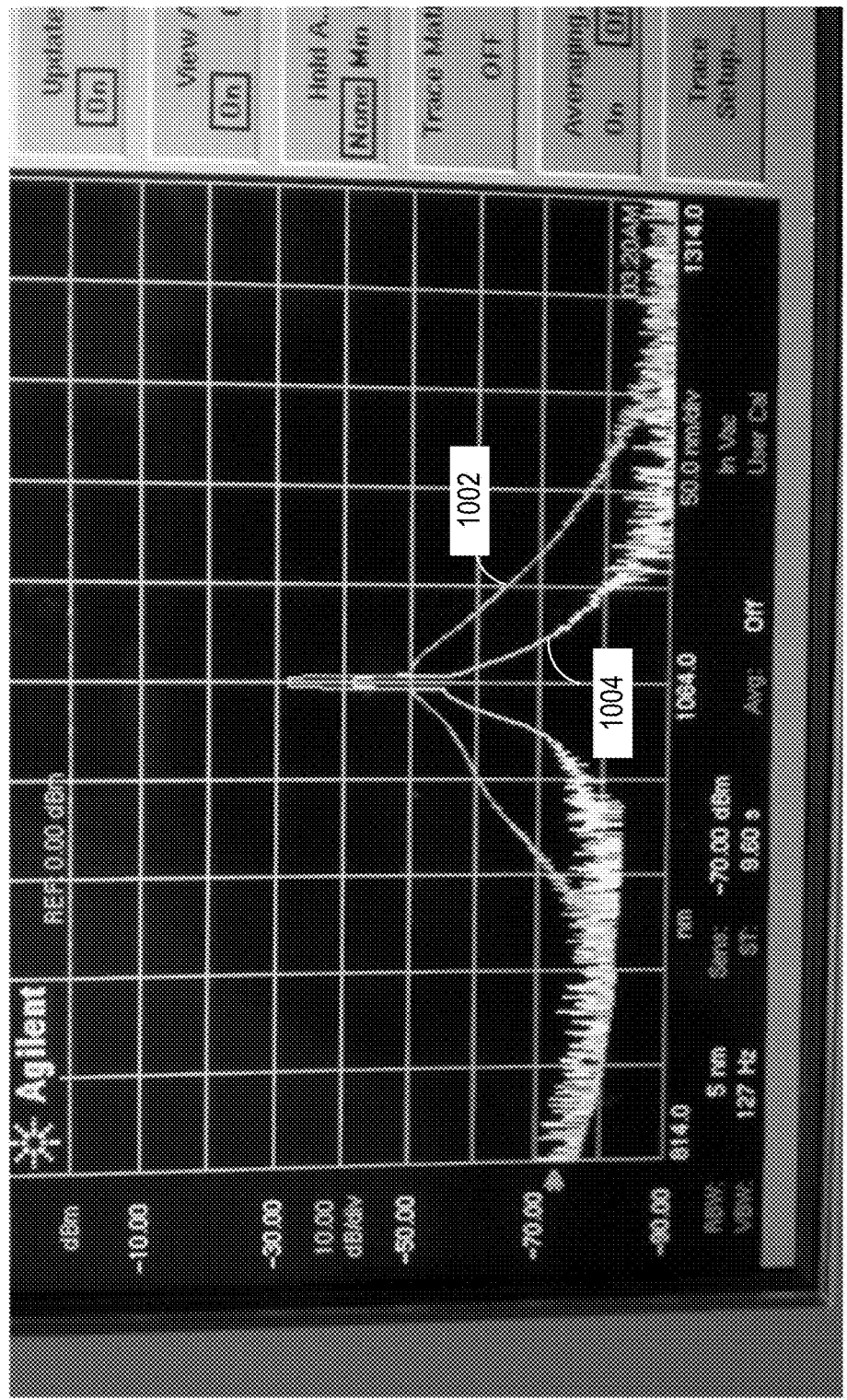

FIG. 9 illustrates laser spectral outputs at a 500 kHz repetition rate with 1 μs and 300 ns prebias durations (50% and 15% duty cycles) as respective curves 902, 904. FIG. 10 illustrates laser spectral outputs at the 500 kHz repetition rate with 1 μs and 25 ns prebiases (50% and 1.25% duty cycles) as respective curves 1002, 1004. Reduction of relatively broadband ASE background is apparent in both FIGS. 9-10.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A seed laser source, comprising:
    a laser diode; and
    a laser diode driver configured to apply a pulsed laser drive signal to the laser diode, wherein the laser drive signal is coupled to provide:
        a seed signal comprising a first seed pulse to the laser diode, the first seed pulse having an amplitude greater than a laser diode threshold amplitude, and
        a corresponding prebias signal comprising a first prebias pulse having a duration in excess of 2 ns and an amplitude less than the laser diode threshold throughout the duration, and that is applied within about 50 ns of the first seed pulse, and wherein:
        the amplitude of the first seed pulse is at least 10 times the laser diode threshold amplitude, and
        the laser diode driver is configured so that the first prebias pulse terminates prior to the first seed pulse, such that the first seed pulse is not applied during the duration of the first prebias pulse.

2. The seed laser source of claim 1, wherein a product of an effective amplitude of the first seed pulse and a duration of the first seed pulse is at least 2 times greater than a product of an effective amplitude and the duration of the first prebias pulse.

3. The seed laser source of claim 2, wherein a product of an effective amplitude of the first seed pulse and a duration of the first seed pulse is at least 20 times greater than a product of an effective amplitude and the duration of the first prebias pulse.

4. The seed laser source of claim 1, wherein the first prebias pulse has an amplitude less than about 0.5 times the laser diode threshold and is applied within about 25 ns of the first seed pulse.

5. The seed laser source of claim 1, wherein the first prebias pulse has an amplitude less than about 0.2 times the laser diode threshold and is applied within about 25 ns of the first seed pulse.

6. The seed laser source of claim 1, wherein the laser diode driver includes a seed signal generator and a prebias signal generator, and a signal combiner configured to combine the seed signal and the prebias signal and couple the combined signal to the laser diode.

7. The seed laser source of claim 1, wherein the laser diode driver is configured to apply the pulsed laser drive signal to the laser diode at a repetition rate between 1 kHz and 100 MHz.

8. A method, comprising:
    establishing optical gain in a laser gain medium;
    producing an optical seed pulse by applying a prebias pulse signal to a laser diode, and a corresponding seed pulse signal to the prebiased laser diode, wherein the prebias pulse signal has a duration of at least 100 ns, and an amplitude that is less than 0.5 times a laser diode threshold throughout the duration and terminates prior to the application of the corresponding seed pulse signal, such that the seed pulse signal is not applied during the duration of any preceding prebias pulse signal; and
    producing at least one optical pulse from the laser gain medium in response to the optical seed pulse.

9. The method of claim 8, wherein the laser gain medium is a doped optical fiber, and further comprising situating the optical gain medium in a laser cavity.

10. The method of claim 9, wherein the laser cavity is defined by one or more fiber Bragg gratings or fiber couplers or combinations thereof.

11. The method of claim 8, wherein the seed pulse signal has an amplitude that is at least 5 times a laser diode threshold.

12. The method of claim 11, wherein the prebias pulse signal has an amplitude that is less than about 0.2 times the laser diode threshold.

13. The method of claim 12, wherein the seed pulse signal is applied within 10 times a laser diode gain lifetime after the prebias pulse signal.

14. The method of claim 12, wherein the seed pulse signal is applied within about 5 times a laser diode gain lifetime after the prebias pulse signal.

15. A system for producing optical pulses, comprising:
    a laser diode;
    a laser diode drive source configured to repetitively apply a prebias pulse signal and a corresponding seed pulse signal to the laser diode to produce a seed laser pulse, wherein the prebias pulse signal has a duration in excess of 2 ns and an amplitude that is less than a laser diode threshold throughout the duration, and wherein the prebias pulse signal terminates prior to application of the corresponding seed pulse signal, such that the seed pulse signal is not applied during the duration of any preceding prebias pulse signal;

a doped optical fiber situated to receive the seed laser pulse; and at least one pump laser configured to couple a pump laser beam to the doped optical fiber so as to produce optical gain in the doped optical fiber.

16. The system of claim 15, wherein the prebias pulse signal and the seed pulse signal have amplitudes associated with about 0.5 times or less of a laser threshold and at least about 4 times the laser threshold, respectively, wherein the prebias pulse signal is applied within about 25 ns of the seed pulse signal.

17. The system of claim 16, wherein a product of an effective amplitude of the seed pulse signal and a duration of the seed pulse signal is at least 2 times greater than a product of an effective amplitude and the duration of the prebias pulse signal.

18. A method, comprising:
repetitively applying a seed signal to a seed laser diode so as to produce seed pulses;
amplifying the seed pulses with a fiber amplifier;
repetitively applying a prebias pulse signal to the seed laser diode prior to application of the seed signals, wherein a duration and amplitude of the prebias pulse signal are selected so as to control amplified spontaneous emission, wherein the prebias pulse signal is modulated between zero and an amplitude that is less than a seed laser diode threshold, and wherein each application of the prebias pulse signal terminates prior to the next application of the seed signal such that a given seed pulse is not produced during the duration of a prior application of the prebias pulse signal.

19. The method of claim 18, wherein the modulated prebias pulse signal has a duration of at least 100 ns, and an amplitude that is less than 0.5 times a laser diode threshold throughout the duration.

* * * * *